(12) United States Patent
Fai et al.

(10) Patent No.: US 8,681,546 B2
(45) Date of Patent: Mar. 25, 2014

(54) VARIABLE IMPEDANCE CONTROL FOR MEMORY DEVICES

(75) Inventors: Anthony Fai, Palo Alto, CA (US); Nicholas Seroff, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 261 days.

(21) Appl. No.: 13/032,560

(22) Filed: Feb. 22, 2011

(65) Prior Publication Data

US 2012/0215958 A1 Aug. 23, 2012

(51) Int. Cl.
G11C 11/34 (2006.01)
(52) U.S. Cl.
USPC .................................................. 365/185.05
(58) Field of Classification Search
USPC .................................................. 365/185.05
See application file for complete search history.

(56) References Cited

U.S. PATENT DOCUMENTS

| | | | |
|---|---|---|---|
| 6,191,663 B1 | 2/2001 | Hannah | |
| 6,349,051 B1 | 2/2002 | Klein | |
| 6,366,972 B1 | 4/2002 | Grebenkemper et al. | |
| 6,530,033 B1 * | 3/2003 | Raynham et al. | 714/5.1 |
| 6,587,896 B1 | 7/2003 | Baldwin et al. | |
| 6,621,155 B1 | 9/2003 | Perino et al. | |
| 6,747,475 B2 | 6/2004 | Yuffe et al. | |
| 7,176,711 B2 | 2/2007 | Park et al. | |
| 7,688,104 B2 | 3/2010 | Park | |
| 2001/0011766 A1 | 8/2001 | Nishizawa et al. | |
| 2003/0221863 A1 | 12/2003 | Marshall et al. | |
| 2005/0166026 A1 * | 7/2005 | Ware et al. | 711/167 |
| 2007/0069374 A1 | 3/2007 | Chen et al. | |
| 2008/0150585 A1 | 6/2008 | Warner et al. | |
| 2009/0300260 A1 * | 12/2009 | Woo et al. | 710/316 |
| 2010/0082911 A1 | 4/2010 | Das | |

FOREIGN PATENT DOCUMENTS

| | | |
|---|---|---|
| EP | 2166717 | 3/2010 |
| JP | 05-341892 | 12/1993 |
| JP | 07-160381 | 6/1995 |
| JP | 10270905 | 10/1998 |
| JP | 11-086546 | 3/1999 |

OTHER PUBLICATIONS

Partial Search Report and Office Action in EP Application No. 12156758, issued Sep. 19, 2012, pp. 1-4.
Search Report in Application No. EP 12 15 6758, mailed Dec. 10, 2012, pp. 1-10.
Translation of Office Action in Application No. JP2012-053736 mailed Oct. 9, 2013.

* cited by examiner

*Primary Examiner* — Huan Hoang
*Assistant Examiner* — Pablo Huerta
(74) *Attorney, Agent, or Firm* — Meyertons, Hood, Kivlin, Kowert & Goetzel, P.C.

(57) ABSTRACT

This document generally describes systems, devices, methods, and techniques for variably controlling impedance for a memory device where multiple NVM units (e.g., NVM dies) are accessible over a shared bus. Impedance can be varied using switches that are configured to switch between a NVM unit and an impedance terminal. Switches can be adjusted during operation of a memory device so that a memory controller is connected over a shared bus to a selected single NVM unit and one or more impedance terminals. Impedance terminals can be configured to provide a relatively small load (a smaller load than an NVM unit) that is impedance matched (alone or in combination with other impedance terminals and/or a NVM unit) with a source impedance on a shared bus that is provided by a memory controller.

20 Claims, 4 Drawing Sheets

VARIABLE IMPEDANCE CONTROL FOR MEMORY DEVICES

TECHNICAL FIELD

This document generally describes devices, systems, techniques, and methods for variably controlling impedance for a memory device.

BACKGROUND

Various types of non-volatile memory (NVM), such as flash memory (e.g., NAND flash memory, NOR flash memory), can be used for mass storage. For example, consumer electronics (e.g., portable media players) use flash memory to store data, including music, videos, images, and other media.

Memory controllers can be used to perform memory operations (e.g., program, read, erase) on NVM. Memory controllers can include a variety of components, including processors, microprocessors, instructions (e.g., software-based program), hardware-based components (e.g., application-specific integrated circuits (ASICs)), volatile memory (e.g., random access memory (RAM)), or any combination thereof. A single memory controller can access multiple units of NVM, such as multiple memory dies (e.g., NAND flash memory dies), over a shared communications channel, e.g., a shared bus. For example, a shared bus can connect each of a plurality of flash memory dies to a memory controller and can be used by such a memory controller to perform memory operations on each of the flash memory dies.

SUMMARY

This document generally describes systems, devices, methods, and techniques for variably controlling impedance for a memory device where multiple NVM units (e.g., NVM dies) are accessible over a shared bus. Impedance can be varied using switches that are configured to switch between a NVM unit and an impedance terminal. Switches can be adjusted during operation of a memory device so that a memory controller is connected over a shared bus to a selected single NVM unit and one or more impedance terminals. Impedance terminals can be configured to provide a relatively small load (a smaller load than an NVM unit) that is impedance matched (alone or in combination with other impedance terminals and/or a NVM unit) with a source impedance on a shared bus that is provided by a memory controller.

In one implementation, a memory device includes a plurality of memory dies, wherein each memory die includes non-volatile memory; a shared bus; a controller; and a plurality of switches between the controller and at least one of the memory dies, wherein each switch is connected to the controller by the shared bus and is configured to switch between: a first connection to one or more of the memory dies to communicatively connect the controller to the one or more memory dies; and a second connection to one or more impedance terminals to connect the controller to the one or more impedance terminals.

In another implementation, a method for impedance matching a memory controller and a plurality of memory dies includes receiving, at a memory controller, an instruction to access a first memory die of a plurality of memory dies, wherein an internal bus is configured to connect each of the plurality of memory dies to the memory controller. The method further includes adjusting, by the memory controller, a plurality of switches associated with the plurality of memory dies to communicatively connect, of the plurality of memory dies, only the first memory die to the memory controller over the internal bus, wherein a source impedance associated with the memory controller is substantially the same as a load impedance connected to the internal bus. The method also includes accessing the first memory die over the internal bus.

In another implementation, a system for impedance matching a controller and a plurality of memory dies includes a plurality of memory dies; a shared bus; a controller; a plurality of switches between the controller and at least one of the memory dies; and non-volatile memory storing instructions that, when executed by the controller, cause the controller to adjust the plurality of switches to establish a first connection to only one of the plurality of memory dies using one of the plurality of switches and to establish a second connection using the others of the plurality of switches such that only one of the plurality of memory dies is communicatively connected to the controller over the shared bus at a time.

Various advantages can be provided. For example, capacitive load on a memory device can be reduced without reducing storage capacity of the memory device and/or its bus speed. Less power can be used to perform memory operations, which can extend a charge for a portable power source, e.g., a battery. In another example, by minimizing reflections through impedance matching, a bit error rate across an internal bus can be reduced and a reliable speed for the bus can be increased.

The details of one or more embodiments are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Capacitive loading can be a concern with memory devices that have multiple NVM units that are statically accessible to a memory controller over a shared bus. With such memory devices, NVM units that are not actively communicating with a memory controller can increase a load that is driven over the shared bus. Such capacitive loading can reduce the overall performance of a memory device. For example, capacitive loading caused by static connections with multiple NVM units may necessitate an increase in drive strength, which can draw more power and drain available power sources (e.g., a battery) more quickly. In another example, such capacitive loading can affect signal integrity and signal speed over a shared bus.

Using switches to temporarily disconnect NVM units that are not actively communicating with a memory controller can reduce a load that is driven over a shared bus. However, a connection that is terminated at a switch may cause a mismatched load and source impedance. Mismatched source and load impedance can cause performance reductions through signal reflections across a shared bus, which can reduce signal integrity (e.g., lower bit error rate) and signal speed.

To address these and other issues, memory devices can be configured to include switches positioned along a shared bus that are configured to switch between a NVM unit (e.g., a flash memory die) and an impedance terminal (e.g., a stub). An impedance terminal can have a small (if not negligible) load and can have associated load impedance that is configured to match source impedance over a shared bus (alone and/or in combination with other actively connected impedance terminals and NVM units, as explained in more detail below). Such impedance terminals can provide a terminated line that minimizes (if not eliminates) signal reflections across a shared bus, which can in turn improve signal integrity and an effective signal speed across the shared bus.

A variety of components can be used as impedance terminals, such as components made of low capacitance material. For example, a stub terminating a connection over a shared bus can be used as an impedance terminal. A stub can be a length of transmission line that is connected at one end only, with the unconnected end being left open-circuit or short-circuited. Load impedance associated with a stub can be configured depending on a variety of factors, e.g., the length of the stub. Loads associated with impedance terminals can be small (if not negligible) relative to a load associated with a NVM unit, such that an effective load driven over a shared bus can be approximately that of a single NVM unit when switches are adjusted to connect a memory controller with a single NVM unit and one or more impedance terminals.

Figure 1:
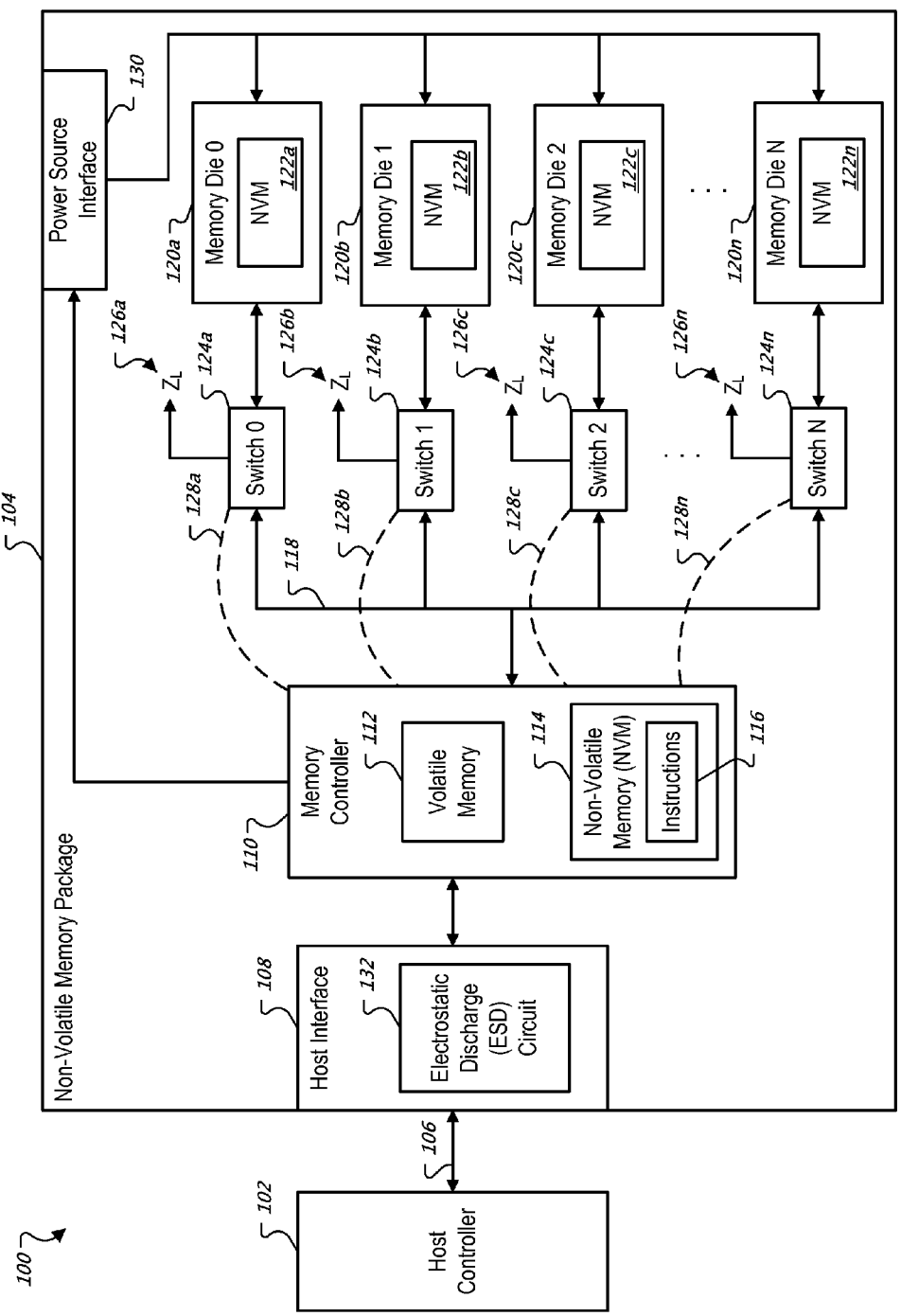
FIG. 1 is a diagram depicting an example system that includes a host controller and a NVM package configured to provide variable impedance control.

FIG. 1 is a diagram depicting an example system 100 that includes a host controller 102 and a NVM package 104 configured to provide variable impedance control. The host controller 102 and/or the NVM package 104 can be included in any of a variety of host devices and/or systems ("hosts"), such as a portable media player (e.g., an IPOD), a cellular telephone (e.g., an (PHONE), a pocket-sized personal computer, a personal digital assistant (PDA), a desktop computer, a laptop computer, and/or a tablet computing device (e.g., an IPAD), to name a few possible examples.

The host controller 102 can include one or more processors and/or microprocessors that are configured to perform operations based on the execution of software and/or firmware instructions. Additionally and/or alternatively, the host controller 102 can include hardware-based components, such as ASICs, that are configured to perform various operations. Operations performed by the host controller 102 can include retrieving data from and/or writing data to a NVM of the NVM package 104. For example, the host controller 102 can provide a request for a media file (e.g., audio file) to the NVM package 104. Such a request provided by the host controller 102 can include one or more logical addresses corresponding to the media file.

The host controller can communicate with the NVM package 104 over a host communication channel 106. Interactions with the NVM package 104 can include providing memory related requests to the NVM package 104, such as requests to retrieve data stored in the NVM package 104 and/or store data in the NVM package 104.

The NVM package 104 can interact with the host controller 102 over the host communication channel 106 using a host interface 108 and a memory controller 110. Like the host controller 102, the memory controller 110 can include one or more processors and/or microprocessors that are configured to perform operations based on the execution of software and/or firmware instructions. Additionally and/or alternatively, the memory controller 110 can include hardware-based components, such as ASICs, that are configured to perform various operations. The memory controller 110 can perform a variety of operations, including memory operations requested by the host controller 102. For example, in response to receiving a request specifying a logical address of a media file to be retrieved, the memory controller 110 can identify one or more corresponding physical addresses (e.g., information identifying die, block, and/or page), retrieve the requested data using the identified physical addresses, and transmit the requested data to the host controller 102 over the host communication channel 106 using the host interface 108.

Various memory management functions, such as error correction and wear leveling, can be performed by the host controller 102 and the memory controller 110, alone or in combination. In implementations where the memory controller 110 is configured to perform at least some memory management functions, the NVM package 104 can be termed "managed NVM" (or "managed NAND" for NAND flash memory). This can be in contrast to "raw NVM" (or "raw NAND" for NAND flash memory), in which the host controller 102 external to the NVM package 104 performs memory management functions for the NVM package 104.

In the example system 100, the memory controller 110 is depicted as including volatile memory 112 and non-volatile memory 114. The volatile memory 112 can be any of a variety of volatile memory, such as cache memory and RAM. The volatile memory 112 can be used by the memory controller 110 to perform operations and/or to store data that is being read from and/or written to NVM. The NVM 114 can be any of a variety of types of NVM and can store instructions 116 that the memory controller 110 uses to perform various operations, including variable impedance control, as described in further detail below.

The memory controller 110 uses a shared internal bus 118 to access multiple memory dies 120a-n, which can be integrated circuit (IC) dies. Although only the single shared bus 118 is depicted with regard to the NVM package 104, an NVM package can include more than one shared internal bus. Each internal bus can be connected to multiple (e.g., 2, 3, 4, 8, 32, etc.) memory dies, as depicted by the multiple memory dies 120a-n. The memory dies 120a-n can be physically arranged in a variety of configurations (e.g., stacked). The memory dies 120a-n are depicted as including NVM 122a-n. The NVM 122a-n can be any of a variety of different types of NVM, such as NAND flash memory based on floating gate or charge trapping technology, NOR flash memory, erasable programmable read only memory (EPROM), electrically erasable programmable read only memory (EEPROM), ferroelectric RAM (FRAM), magnetoresistive RAM (MRAM), phase change memory (PCM), or any combination thereof.

Switches 124a-n are positioned along the shared bus 118 between the memory controller 110 and the memory dies 120a-n. The switches 124a-n can be pass transistors with a negligible amount of signal bounce and low noise. The switches 124a-n can be used to switch between the memory dies 120a-n and impedance terminals 126a-n (denoted as $Z_L$ (load impedance)). The impedance terminals 126a-n can be any suitable component with low capacitive loading and load impedance that can be selected to match source impedance ($Z_S$) over the shared bus 118. For example, impedance terminals 126a-n can be stubs, as described above.

The switches 124a-n can be controlled by the memory controller 110, as indicated by lines 128a-n. The memory controller 110 can control the switches 124a-n by, for example, using an address decoder and/or using chip enable signals for the memory dies 120a-n (described in further detail with regard to FIG. 2).

The memory controller 110 can be configured, through software/firmware instructions (e.g., the instructions 116) and/or hardware-based components (e.g., ASICs), to control the switches 124a-n so as to minimize the capacitive load driven by the shared bus 118 while having impedance matched terminals. For instance, with the example system 100, the load can be minimized by controlling the switches 124a-n so that the controller is connected to one of the memory dies 120a-n at a time, with the other connections being to the impedance terminals 126a-n.

For example, if the memory controller 110 receives a request from the host controller 102 to retrieve data that is stored in the NVM 122a of memory die 120a, the memory controller 110 can adjust the switches 124a-n so that the memory controller 110 is connected to the die 120a and to the impedance terminals 126b-n over the shared bus 118. After retrieving the requested data from the memory die 120a, the memory controller 110 can adjust the switches 124a-n so as to communicate with another one of the memory dies 120b-n (e.g., by connecting the memory controller 110 to memory die 120b using switch 124b and to impedance terminals 126a, 126c-n using switches 124a, 124c-n).

By adjusting the switches 124a-n so that one of the memory dies 120a-n is connected to the memory controller 110 over the shared bus 118, a load that is driven over the bus 118 can be the sum of loads associated with the connected impedance terminals (n–1 impedance terminals) and a load associated with the connected memory die, where n is the number of switches and associated impedance terminals. For instance, the load can be $((n-1)*Z_L$ load)+memory die load. In contrast, a configuration where each of the memory dies 120a-n is connected to the memory controller 110 over the shared bus 118 would have an associated load of n*memory die load, where n is the number of memory dies. By controlling the switches 124a-n between the memory dies 120a-n and the impedance terminals 126a-n as discussed above, the load driven over the shared bus 118 can be reduced by $((n-1)*$memory die load)$-Z_L$ load, where n is the number of switches and associated impedance terminals. As described above, the impedance terminals 126a-n can be constructed of a low capacitance material, meaning that an impedance terminal can have a small load relative to a load for one of the memory dies 120a-n (e.g., a NAND flash memory die). The reduced load driven over the bus 118 can provide power savings and can extend battery life.

Signal reflection along the bus 118 can be minimized by matching source impedance associated with the memory controller 110 and a load impedance associated with the impedance terminals 126a-n and memory dies 120a-n connected by the switches 124a-n. In the example system 100, the impedance terminals 126a-n can be configured to each have an associated impedance that is the same (or within a threshold value of) an impedance associated with one of the memory dies 120a-n. Depending on the configuration used (e.g., star configuration), each of the impedance terminals 126a-n and the each of the memory dies 120a-n can be tuned to match the source impedance associated with the memory controller 110. For instance, when the switches 124a-n are adjusted such that one of the memory dies 120a-n is connected to the memory controller 110 over the bus 118, a load impedance connected to the memory controller 110 from each of the switches 124a-n can be the same (or within a threshold value) of a source impedance associated with the memory controller 110.

Although the memory dies 120a-n, switches 124a-n, and impedance terminals 126a-n are depicted as being connected to the memory controller 110 using a star configuration, other configurations are possible. For example, a "bus" configuration where the memory dies 120a-n, switches 124a-n, and impedance terminals 126a-n are positioned along the bus 118 in serial can be used. In other configurations, impedance matching with the memory controller 110 and the memory dies 120a-n, switches 124a-n, and impedance terminals 126a-n can be different than what is described above with regard to the example system 100. For example, in a bus configuration, the impedance terminals 126a-n may be tuned to have different impedance values depending on whether they are located at the end of the bus or between the end of the bus and the memory controller 110.

The switches 124a-n are depicted in the example system 100 as having a one-to-one ratio with both the memory dies 120a-n and the impedance terminals 126a-n. Other ratios are also possible. For example, the system 100 can be configured where the switches 124a-n have a one-to-two ratio with the memory dies 120a-n and a one-to-one ratio with the impedance terminals 126a-n such that each switch 124a-n is connected to two memory dies and one impedance terminal.

The memory controller 110 can additionally be configured to protect the NVM memory package 104 against various issues that may arise when the switches 124a-n are being adjusted, such as electrostatic discharge (ESD). When the switches 124a-n are being adjusted, the source and load impedances may be mismatched and the memory package 104 may be susceptible to ESD, for instance, during power on of the system 100. To protect the memory package 104, the memory controller 110 can disconnect power from the memory dies 120a-n before adjustment of the switches 124a-n begins. Once the switches 124a-n have been adjusted, the memory controller 110 can reconnect the power to the memory dies 120a-n and proceed with memory operations over the bus 118.

A variety of mechanisms can be used to toggle the power to the memory dies 120a-n "on" and "off." In the depicted example, the memory controller 110 can interact with a power source interface 130 that is configured to provide operational power to the memory dies 120a-n from a power source (not depicted) that can be located as part of or separate from the memory package 104. The memory controller 110 can provide signals to the power source/power source interface 130 that causes the power source interface 130 to connect and disconnect power from the memory dies 120a-n.

In conjunction with toggling the power supplied to the memory dies 120a-n to protect against ESD, the host interface 108 (as well as other external interfaces, like the power source interface 130) can include an ESD circuit 132 that is configured to protect the package 104 from ESD spikes that may be received through the interface 108. The ESD circuit 132 can include any of a variety of components that are capable of shielding against ESD, such as zener diodes, metal oxide varistors (MOVs), transient voltage suppression (TVS) diodes, and regular complementary metal oxide semiconductor (CMOS) or bipolar clamp diodes.

The ESD circuit 132 can turn ESD protection on and off depending on the power that is being supplied to the memory package 104. For instance, when the power being supplied to the memory package 104 is stable (e.g., at a level that is normal for operation of the memory package 104), the ESD circuit 132 can turn ESD protection off. However, when the power supplied to the memory package 104 is low (e.g., the memory package 104 is receiving little or no power), high, or in a state of flux, the ESD circuit 132 can turn on the ESD protection. For instance, the ESD circuit 132 can turn the ESD protection on when the system 100 is powering up and/or down, but can turn the ESD protection off once the system 100 has been powered up and is running normally. The ESD circuit 132 can use any of a variety of components to control when ESD protection is turned on and off. As just one example, the ESD circuit can include a depletion mode transistor configured to detect input voltage (Vcc) and to turn ESD protection on/off based on the detected voltage. The ESD protection toggling can be used to reduce the capacitance associated with the memory package 104 when it is operating normally (e.g., not powering up or down).

Figure 2:
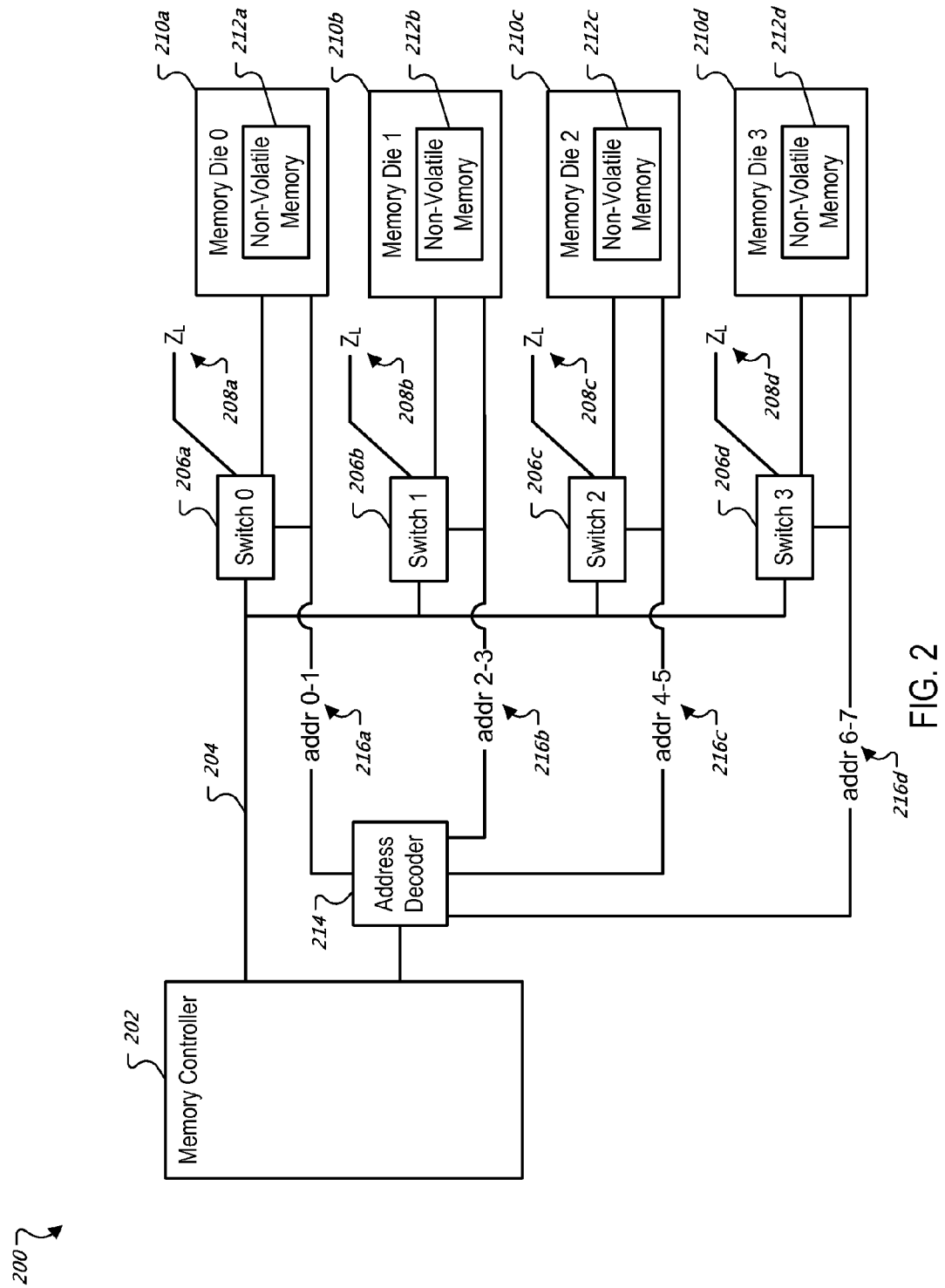
FIG. 2 is a diagram depicting an example system that includes a memory controller configured to provide variable impedance control, at least in part, using chip enable signals.

FIG. 2 is a diagram depicting an example system 200 that includes a memory controller 202 configured to provide variable impedance control, at least in part, using chip enable signals. The example system 200 is similar to the example system 100 described above with regard to FIG. 1.

For instance, the system 200 includes the memory controller 202 connected to memory dies 210a-d by an internal bus 204, like the memory controller 110 described with regard to FIG. 1 as being connected to the memory dies 120a-n by the internal bus 118. The system 200 also includes switches 206a-d that are positioned along the bus 204 between the memory dies 210a-d and the memory controller 202, like the switches 124a-n described above with regard to FIG. 1. The switches 206a-d are configured to switch between impedance terminals 208a-d and the memory dies 210a-d. The memory controller 202, the bus 204, the switches 206a-d, the impedance terminals 208a-d, the memory dies 210a-d, and the NVM 212a-d, can be similar to the memory controller 110, the bus 118, the switches 124a-n, the impedance terminals 126a-n, the memory dies 120a-n, and the NVM 122a-n, respectively.

The system 200 is depicted as including an address decoder 214 that is configured to provide chip enable signals to the memory dies 210a-d. The address decoder 214 can identify a memory die to which a given memory operation pertains based on an address (e.g., physical address) associated with the memory operation. The address decoder 214 can send appropriate signals along channels 216a-d so as to enable the identified memory die and to disable to the other memory dies. For instance, as depicted on the example channels 216a-d, chip enable signals can be sent to the memory die 210a for addresses 0-1; to the memory die 210b for the addresses 2-3; to the memory die 210c for the addresses 4-5; and to the memory die 210c for the addresses 6-7.

The switches 206a-d can be controlled by chip enable signals provided through the channels 216a-d by address decoder 214. For instance, when the controller 202 seeks to perform a memory operation with the memory die 210a, at least a portion of the corresponding address (e.g., physical address, logical address) for the memory operation can be provided to the address decoder 214. The address decoder 214 can transmit a chip enable signal (e.g., a high value representing 1) using the channel 216a to the switch 206a and the memory die 210a. Such a chip enable signal can cause the switch 216a to be adjusted such that the memory controller 202 is connected to the memory die 210a over the bus 204. The address decoder 214 can also send chip disable signals (e.g., low values representing 0) using the channels 216b-d to the switches 206b-d and the memory dies 210b-d. The chip disable signals can cause the switches 206b-d to be adjusted such that the impedance terminals 208b-d are connected to the memory controller 202 over the bus 204. As discussed above with regard to FIG. 1, various techniques can be used to protect the system 202 from ESD while the switches 206a-d are being adjusted.

Figure 3:
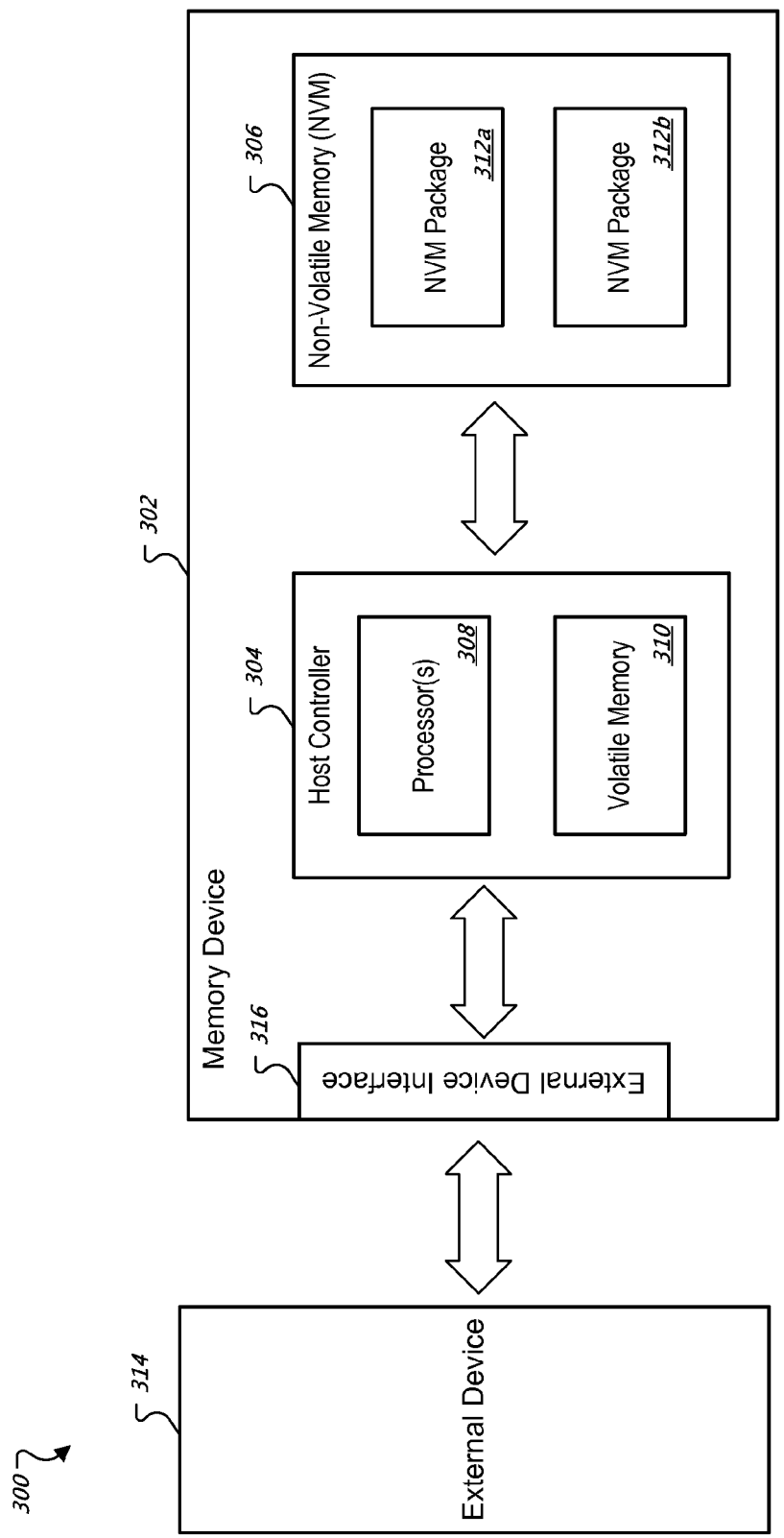
FIG. 3 is a diagram depicting an example system that includes a memory device configured to provide variable impedance control.

FIG. 3 is a diagram depicting an example system 300 that includes a memory device 302 configured to provide variable impedance control. The memory device 302 can be any suitable memory devices, including a portable media player (e.g., an IPOD), a cellular telephone (e.g., an (PHONE), a pocket-sized personal computer, a personal digital assistant (PDA), a desktop computer, a laptop computer, a tablet computing device (e.g., an IPAD), and/or a removable/portable storage device (e.g., a flash memory card, a USB flash memory drive).

The memory device 302 includes a host controller 304 and NVM 306. The host controller 304 can be similar to the host controller 102 described above with regard to FIG. 1. The host controller 304 includes one or more processors 308 and volatile memory 310. The processors 308 can include any suitable type of processors, including microprocessors, central processing units (CPUs), graphics processing units (GPUs), or any combination thereof. The volatile memory 310 can be similar to the volatile memory 112 described above with regard to FIG. 1. The volatile memory 310 can be used by the processors 308 to perform various operations, such as retrieving and processing data stored in the NVM 306.

The NVM 306 can include one or more NVM packages 312a-b. The NVM packages 312a-b can each be similar to the NVM package 104 described above with regard to FIG. 1. For instance, the NVM packages 312a-b can each include a plurality of memory dies with NVM (e.g., memory dies 120a-n and NVM 122a-n), one or more memory controllers (e.g., memory controller 110), one or more busses connecting the memory controllers to the memory dies (e.g., bus 118), a plurality of switches positioned between the memory controllers and the memory dies (e.g., switches 124a-n), and impedance terminals configured to provide a low or minimal load and matched load impedance (e.g., impedance terminals 126a-n). The NVM 306 can include any number of NVM packages (e.g., 2, 3, 4, 8, 16, etc.).

As described above with regard to FIG. 1, management of the NVM can be performed by the host controller 304 and/or controllers of the NVM packages 312a-b. In implementations where controllers of the NVM packages 312a-b control at least a portion of the memory management operations (e.g., error correction, wear leveling, etc.), the NVM packages 312a-b may be considered to be "managed" NVM.

The system 300 is depicted as also including an external device 314 that can be communicatively connected (directly and/or indirectly) to the memory device 302. Communication between the external device 314 and the memory device 302 can include the transmission of data and/or instructions between the two devices. The external device 314 can be any of a variety of electronic devices, such as a desktop computer, a laptop computer, and a media computing device (e.g., a media server, a television, a stereo system). The memory device 302 can communicate with the external device 314 through a physical and/or wireless connection using an external device interface 316 (e.g., wireless chip, USB interface, etc.).

In one example implementation, the memory device 302 can be a portable media player (e.g., an IPOD) and the external device 314 can be a desktop computer that can transmit media files (e.g., audio files, video files, etc.) to each other over a physical connection (e.g., USB cable). When communicating with the external device 314, the memory device 302 can use the variable impedance matching techniques discussed to provide and store files requested by the external device 314.

Figure 4:
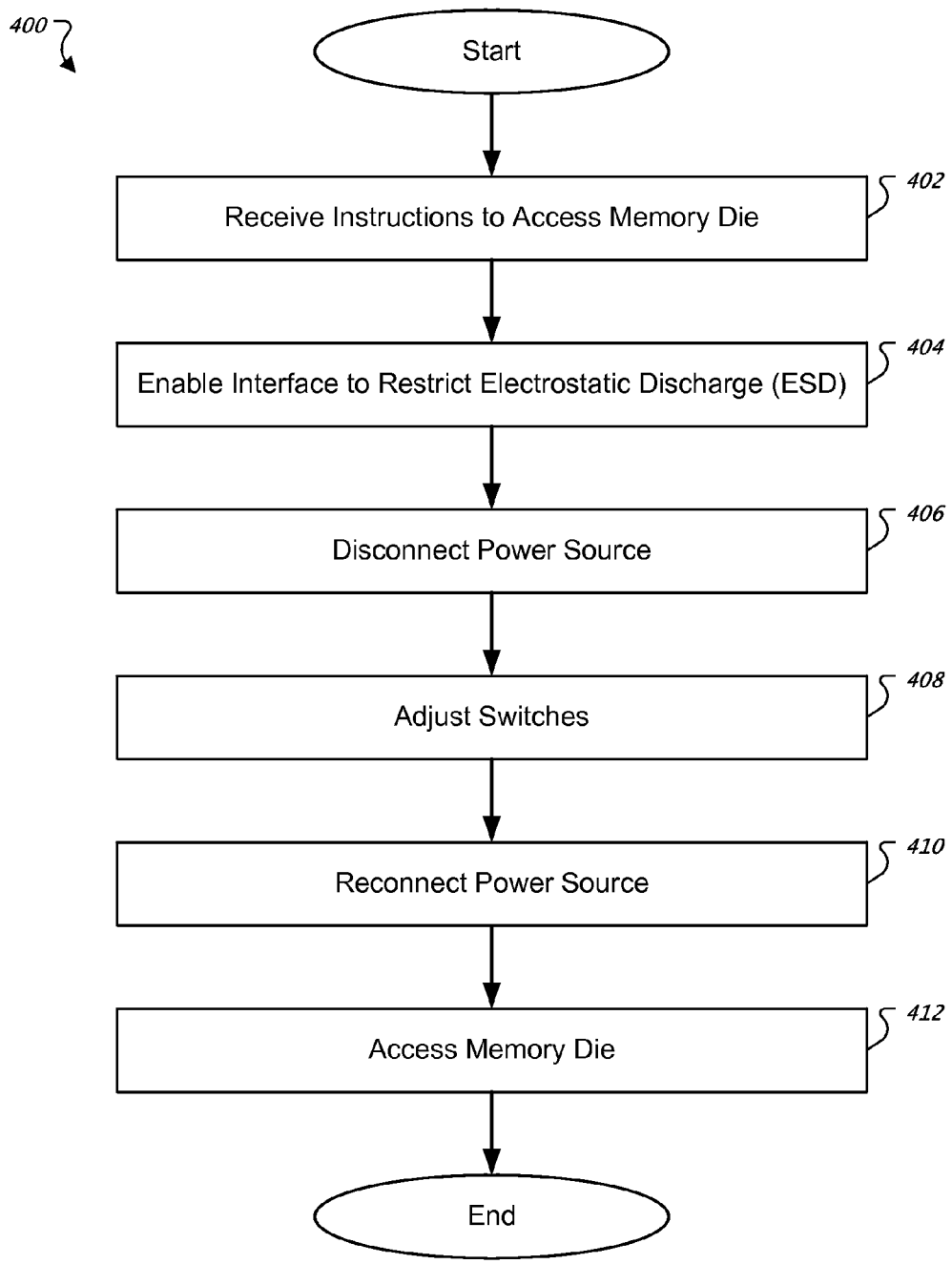
FIG. 4 is a flowchart depicting an example technique for providing variable impedance control with a memory device.

FIG. 4 is a flowchart depicting an example technique 400 for providing variable impedance control with a memory device. For example, the technique can provide variable impedance control by matching a source impedance associated with a memory controller and a load impedance associated with a plurality of memory dies. The technique 400 can be performed by a variety of memory devices, such as the NVM package 104 described above with regard to FIG. 1, and/or the memory device 302 described above with regard to FIG. 3. In particular, the technique 400 can be performed by a memory controller to provide variable impedance control, such as the memory controller 110 described above with regard to FIG. 1.

The technique 400 starts at step 402 by receiving instruction to access a memory die. For example, the memory controller 110 can receive instructions from the host controller 102 to retrieve data stored in the memory die 120a.

In response to receiving the instructions, an external interface to restrict ESD can be enabled (step 404) and memory dies can be disconnected from a power source (step 406). Steps 404 and 406 can be performed in preparation for adjusting switches (e.g., switches 124a-n) that selectively switch connections to either impedance terminals (e.g., impedance terminals 126a-n) or memory dies (e.g., memory dies 120a-n) in order to provide variable impedance control. As described above with regard to FIG. 1, the NVM package 104 can be susceptible to ESD while the switches 124a-n are being adjusted. To protect against ESD when a memory device could potentially be damaged, a circuit to restrict ESD (e.g., the ESD circuit 132) can be enabled to restrict ESD from being provided through an interface (e.g., the host interface 108) from a host (e.g., the host controller 102) that is external to a memory device (e.g., NVM package 104). As another or alternative countermeasure, connections between memory dies and a power source can be temporarily interrupted in anticipation of adjusting switches between memory dies and impedance terminals. For instance, the memory controller 110 can cause a power source interface 130 to disconnect the memory dies 120a-n from a power source before adjusting the switches 124a-n.

At step 406, switches that switch between memory dies and impedance terminals on an internal bus can be adjusted. The switches can be adjusted so that, of a plurality of memory dies that are available along the internal bus, only a memory die to which the received instructions pertain is connected to a memory controller over the bus. For instance, if the received instructions pertain to the memory die 120a, then the memory controller 110 can adjust the switches 124a-n so that the memory die 120a and the impedance terminals 126a-n are connected to the memory controller 110 over the bus 118.

After the switches have been adjusted, a power source can be reconnected to the memory dies (step 410). After the switches have been adjusted, risks associated with ESD can be reduced based on impedance being matched between a memory controller and the impedance terminals/memory dies. For example, after the switches 124a-n have been adjusted, the memory controller 110 can cause the power source 130 to reconnect the memory dies 120a-n with a power source.

After a power source has been reconnected to memory dies, the memory die to which the received instructions pertain can be accessed (step 412). Accessing a memory die can include performing any memory operation pertaining to the memory die, including reading, writing, erasing, and/or performing higher level memory management operations like error correction and wear leveling. For example, if the received instructions pertain to retrieving data from the memory die 120a, the memory controller 110 can obtain the requested data by interacting with the memory die 120a over the bus 118. The technique 400 can end after step 412.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. Moreover, other mechanisms for providing variable impedance control may be used. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A memory device comprising:
    a plurality of memory dies arranged in parallel, wherein each memory die includes non-volatile memory;
    a shared bus;
    a controller; and
    a plurality of switches arranged in parallel between the controller and the plurality of the memory dies, wherein each switch is connected to the controller by the shared bus and wherein each switch is configured to switch between:
        a first connection to a respective die of the plurality of memory dies to communicatively connect the controller to the connected respective die of the plurality of memory dies; and
        a second connection to one or more impedance terminals to connect the controller to the one or more impedance terminals.

2. The memory device of claim 1, wherein the controller is configured to control the switches such that a source impedance associated with the controller is substantially matched to a load impedance of the memory dies and the impedance terminals connected to the controller by the switches.

3. The memory device of claim 2, wherein the controller is further configured to control the switches such that, while communicating over the shared bus, the controller is connected to a given one of the plurality of memory dies and to one or more of the impedance terminals.

4. The memory device of claim 3, wherein each switch of the plurality of switches is associated with one of the memory dies and one of the impedance terminals.

5. The memory device of claim 3, wherein a load provided by the connected given one of the memory dies and the connected one or more impedance terminals over the shared bus is substantially the same as a load provided by the given one of the memory dies.

6. The memory device of claim 3, wherein the controller is further configured to temporarily disconnect a power source from providing power to the plurality of memory dies while the switches are switched to connect a different memory die to the controller.

7. The memory device of claim 1, wherein the non-volatile memory of the memory dies includes flash memory.

8. The memory device of claim 1, wherein each impedance terminal includes a stub.

9. The memory device of claim 1, wherein the plurality of memory dies include a multi-chip stack of memory dies.

10. A memory device comprising:
    a plurality of memory dies, wherein each memory die includes non-volatile memory;
    a shared bus;
    a controller;
    a plurality of switches between the controller and at least one of the memory dies, wherein each switch is connected to the controller by the shared bus and is configured to switch between:
        a first connection to one or more of the memory dies to communicatively connect the controller to the one or more memory dies; and
        a second connection to one or more impedance terminals to connect the controller to the one or more impedance terminals;
    a second bus communicatively connecting the controller to a host device external to the controller and the memory dies; and
    an electrostatic discharge circuit connected to the second bus between the controller and the host device, wherein the electrostatic discharge circuit is configured to restrict electrostatic discharge from the host device during, at least, switching one or more of the switches between a first connection to one or more of the memory dies and a second connection to one or more of the impedance terminals.

11. A method for impedance matching a memory controller and a plurality of memory dies, the method comprising:

receiving, at a memory controller coupled to an internal bus, an instruction to access a given one memory die of a plurality of memory dies; and adjusting, by the memory controller, a plurality of switches arranged in parallel, wherein each switch of the plurality of switches is configured to selectively couple a respective one of the plurality of memory dies, arranged in parallel, or a load impedance to the memory controller over the internal bus, wherein a source impedance associated with the memory controller is substantially the same as the load impedance connected to the internal bus.

12. The method of claim 11, wherein adjusting the plurality of switches connects one or more stubs to the memory controller over the internal bus instead of connecting the plurality of memory dies other than the given one memory die; and wherein the load impedance includes a combined impedance of the first memory die and the one or more stubs.

13. The method of claim 11, further comprising:

before adjusting the plurality of switches, disconnecting a power source from providing power to the plurality of memory dies; and after adjusting the plurality of switches, reconnecting the power source to provide power to the plurality of memory dies.

14. A method for impedance matching a memory controller and a plurality of memory dies, the method comprising:

receiving, at a memory controller, an instruction to access a first memory die of a plurality of memory dies, wherein an internal bus is configured to connect each of the plurality of memory dies to the memory controller;

adjusting, by the memory controller, a plurality of switches associated with the plurality of memory dies to communicatively connect, of the plurality of memory dies, only the first memory die to the memory controller over the internal bus, wherein a source impedance associated with the memory controller is substantially the same as a load impedance connected to the internal bus;

accessing the first memory die over the internal bus; and restricting electrostatic discharge from the host on an external interface while adjusting the plurality of switches.

15. A system for impedance matching a controller and a plurality of memory dies, the system comprising:

a plurality of memory dies arranged in parallel;

a shared bus;

a controller;

a plurality of switches arranged in parallel wherein each switch of the plurality of switches is configured to selectively couple a respective one of the plurality of memory dies or a load impedance to the memory controller over the shared bus; and non-volatile memory storing instructions that, when executed by the controller:

cause the controller to adjust the plurality of switches to establish a first connection to a respective die of the plurality of memory dies using one of the plurality of switches;

to establish a second connection using the others of the plurality of switches such that the load impedances are connected to the internal bus; and only one of the plurality of memory dies is communicatively connected to the controller over the shared bus at a time.

16. The system of claim 15, wherein a load provided by the connected respective die of the memory dies and the connected one or more impedance terminals over the shared bus is substantially the same as a load provided by the given one of the memory dies.

17. The system of claim 15, further comprising a power source that is configured to provide power to the plurality of memory dies; and wherein execution of the stored instructions further causes the controller to disconnect the power source from the plurality of memory dies when adjusting the plurality of switches.

18. The system of claim 15, wherein the controller is configured to control the switches such that, while communicating over the shared bus, the controller is connected to a given one of the memory dies and to one or more of the impedance terminals.

19. A system for impedance matching a controller and a plurality of memory dies, the system comprising:

a plurality of memory dies;

a shared bus;

a controller;

a plurality of switches between the controller and at least one of the memory dies;

non-volatile memory storing instructions that, when executed by the controller, cause the controller to adjust the plurality of switches to establish a first connection to only one of the plurality of memory dies using one of the plurality of switches and to establish a second connection using the others of the plurality of switches such that only one of the plurality of memory dies is communicatively connected to the controller over the shared bus at a time; and an external interface to a host device, wherein the external interface includes an electrostatic discharge circuit that is configured to restrict electrostatic discharge from the host device during, at least, adjustment of the switches.

20. The system of claim 19, wherein the electrostatic discharge circuit includes a depletion mode transistor that is configured to be activate electrostatic discharge restrictions based on the voltage level provided from the host device through the external interface.

* * * * *